(12) United States Patent
Belloni et al.

(10) Patent No.: US 12,017,907 B2
(45) Date of Patent: Jun. 25, 2024

(54) CAPACITANCE GAP MEASUREMENT

(71) Applicant: InvenSense, Inc., San Jose, CA (US)

(72) Inventors: Edoardo Belloni, Milan (IT); Luca Coronato, Corsico (IT); Giacomo Gafforelli, Casatenovo (IT)

(73) Assignee: InvenSense, Inc., San Jose, CA (US)

( * ) Notice: Subject to any disclaimer, the term of this patent is extended or adjusted under 35 U.S.C. 154(b) by 344 days.

(21) Appl. No.: 17/559,435

(22) Filed: Dec. 22, 2021

(65) Prior Publication Data

US 2022/0234883 A1    Jul. 28, 2022

Related U.S. Application Data

(60) Provisional application No. 63/142,374, filed on Jan. 27, 2021.

(51) Int. Cl.
B81B 3/00        (2006.01)

(52) U.S. Cl.
CPC .... B81B 3/0018 (2013.01); *B81B 2201/0292* (2013.01); *B81B 2203/04* (2013.01)

(58) Field of Classification Search
CPC .......... B81B 3/0018; B81B 2201/0292; B81B 2203/04; B81C 99/004
See application file for complete search history.

(56) References Cited

U.S. PATENT DOCUMENTS

| 10,416,107 | B2 | 9/2019 | Godfrey | |
|---|---|---|---|---|
| 10,809,048 | B2 | 10/2020 | Negishi | |
| 11,209,296 | B2 | 12/2021 | Willcox | |
| 2011/0057899 | A1* | 3/2011 | Sleeman | G01L 1/146 345/174 |
| 2015/0370356 | A1* | 12/2015 | Hwang | G06F 3/0445 345/173 |
| 2018/0238927 | A1* | 8/2018 | Castro | G01P 15/125 |

FOREIGN PATENT DOCUMENTS

| CN | 111397701 B | 3/2022 |
|---|---|---|
| WO | WO2021202184 A1 | 10/2021 |

OTHER PUBLICATIONS

Chou et al. ("A Novel Design to Eliminate Fringe Field Effects for Liquid Crystal on Silicon," Jpn. J. Appl. Phys., vol. 41, Part 1, No. 12, pp. 7386-7390, 2002) (Year: 2002).*

* cited by examiner

*Primary Examiner* — Yasser A Abdelaziez
(74) *Attorney, Agent, or Firm* — Van Hoven PC; Joshua Van Hoven (57) ABSTRACT

A microelectromechanical system (MEMS) test structure includes a plurality of capacitors formed from sense electrodes and capacitive plates having a predetermined geometry and size associated with a related MEMS device such as a MEMS sensor. Based on the predetermined relationships between the capacitors of the test structure, and between the test structure and the MEMS devices, an effect of fringing fields on the sensed capacitances of the MEMS devices may be eliminated, and the capacitive gap of the MEMS device may be accurately measured.

22 Claims, 9 Drawing Sheets

CAPACITANCE GAP MEASUREMENT

CROSS REFERENCE TO RELATED APPLICATIONS

This disclosure claims the benefit of U.S. Provisional Application No. 63/142,374, filed Jan. 27, 2021, which is hereby incorporated by reference herein in its entirety.

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) devices such as accelerometers and gyroscopes capture complex movements and determine orientation or direction. For example, smartphones are equipped with accelerometers and gyroscopes to understand the movement of the smartphone, to augment navigation systems that rely on Global Position System (GPS) information, and to perform numerous other functions. Wearable devices and internet-of-things (IoT) devices constantly measure movement and other characteristics of a person, animal, or electronic device. In another example, drones and aircraft determine orientation based on gyroscope measurements (e.g., roll, pitch, and yaw), and vehicles of all types implement assisted driving to improve safety (e.g., to recognize skid or roll-over conditions).

As MEMS devices are placed in ever more environments and are increasingly used for critical functions such as vehicle controls, a premium is placed upon accuracy of the measurements and other functions performed by such devices. Due to the microscopic scale of such devices, even minor deviations in fabrication processes in accordance with typical semiconductor manufacturing tolerances may result in appreciable differences in measurements made by MEMS devices.

SUMMARY OF THE INVENTION

In an embodiment of the present disclosure, a microelectromechanical system (MEMS) test structure may comprise at least one capacitive plate located in a MEMS layer, a surface of the at least one capacitive plate defining a first plane and a first sense electrode located on a second plane parallel to the first plane, the first sense electrode defining a first sense electrode area and a first sense electrode perimeter. The MEMS test structure may further comprise a second sense electrode on the second plane parallel to the first plane, the second sense electrode defining a second sense electrode area and a second sense electrode perimeter. The MEMS test structure may further comprise processing circuitry coupled to the first sense electrode to generate a first sense signal representative of a first capacitance between the at least one capacitive plate and the first sense electrode and to the second sense electrode to generate a second sense signal representative of a second capacitance between the at least one capacitive plate and the second sense electrode, compare the first sense signal to the second sense signal, remove a fringing portion of the compared signals based on the first sense electrode perimeter and the second sense electrode perimeter, and determine a gap between the at least one capacitive plate and the first sense electrode based on the first sense electrode area, the second sense electrode area, and the removal of the fringing portion of the compared signals.

In an embodiment of the present disclosure, a method for measuring a capacitive gap of one or more microelectromechanical system (MEMS) sensors by a MEMS test structure may comprise receiving, at processing circuitry from a first sense electrode, a first sense signal representative of a first capacitance between at least one capacitive plate and the first sense electrode, wherein the first sense electrode defines a first sense electrode area and a first sense electrode perimeter. The method may further comprise receiving, at the processing circuitry from a second sense electrode, a second sense signal representative of a second capacitance between the at least one capacitive plate and the second sense electrode, wherein the second sense electrode defines a second sense electrode area and a second sense electrode perimeter. The method may further comprise comparing, by the processing circuitry, the first sense signal to the second sense signal. The method may further comprise removing, by the processing circuitry, a fringing portion of the compared signals based on the first sense electrode perimeter and the second sense electrode perimeter, and determining, by the processing circuitry, the gap between the at least one capacitive plate and the first sense electrode based on the first sense electrode area, the second sense electrode area, and the removal of the fringing portion of the compared signals.

In an embodiment of the present disclosure, a microelectromechanical system (MEMS) wafer may comprise a plurality of dies including a plurality of MEMS devices, wherein the plurality of MEMS devices are one of a plurality of MEMS gyroscopes, a plurality of MEMS accelerometers, a plurality of MEMS microphones, or a plurality of MEMS pressure sensors. The MEMS wafer may further comprise at least one die including a test structure, wherein the test structure comprises at least one capacitive plate located in a MEMS layer, the bottom surface of the at least one capacitive plate defining a first plane, a first sense electrode located on a second plane parallel to the first plane, the first sense electrode defining a first sense electrode area and a first sense electrode perimeter, and a second sense electrode on the second plane parallel to the first plane, the second sense electrode defining a second sense electrode area and a second sense electrode perimeter. The MEMS wafer may further comprise processing circuitry coupled to the first sense electrode to generate a first sense signal representative of a first capacitance between the at least one capacitive plate and the first sense electrode and to the second sense electrode to generate a second sense signal representative of a second capacitance between the at least one capacitive plate and the second sense electrode, compare the first sense signal to the second sense signal, remove a fringing portion of the compared signals based on the first sense electrode perimeter and the second sense electrode perimeter, and determine a gap between the at least one capacitive plate and the first sense electrode based on the first sense electrode area, the second sense electrode area, and the removal of the fringing portion of the compared signals, wherein the determined gap is representative of a gap of the plurality of MEMS devices.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

MEMS devices such as MEMS accelerometers, gyroscopes, pressure sensors, and microphones may utilize capacitive sensing to determine a parameter of interest. Microelectromechanical components are fabricated within a MEMS layer of a sensor using semiconductor fabrication processes. These components, such as a proof mass of an inertial sensor or a diaphragm of a pressure sensor or microphone, are movable in response to a force or stimulus of interest such as an inertial force, change in pressure, or acoustic signal. This movement in turn is sensed based on a change in distance with respect to an adjacent sense electrode in the MEMS layer (e.g., for in-plane sensing) or on a plane parallel to a bottom plane of the MEMS layer (e.g., for out-of-plane sensing). This movement results in a change in a capacitance between the moveable MEMS component(s) and the sense electrode(s), which is measured and processed to determine the parameter of interest.

The accuracy of the measurement of the parameter of interest is thus based at least in part on a correspondence of an actual capacitive gap in the MEMS device corresponding to an expected capacitive gap. Moreover, the overall capacitance is affected by "fringing" or "fringe" fields that exist at the edges of these capacitive gaps, where the planes of the MEMS components and the sense electrodes are not directly facing. Even with high-precision semiconductor fabrication processes operating within typical tolerances, changes in the capacitive gap and fringing fields may result in appreciable differences in output measurements of otherwise identical MEMS devices, for example, between different manufacturing batches or even different wafers.

A test structure that includes multiple capacitors may be formed by the same fabrication processes as associated MEMS devices, such that the capacitive gaps of the test structure are identical or proportional to the capacitive gaps of the associated MEMS devices. The multiple capacitors of the test structure have a geometry and proportional size such that, in combination with capacitance measurements from the respective capacitors, known dimensions associated with the capacitors of the test structures may be used to determine both the effect of fringing fields on the overall capacitance of the test structure, as well as to determine the capacitive gap of the test structure. Based on known relationships between the test structure and associated MEMS device(s) (e.g., based on a common wafer, die, or manufacturing batch), operational parameters of the MEMS device(s) such as scaling factors or offsets may be optimized.

Figure 1:
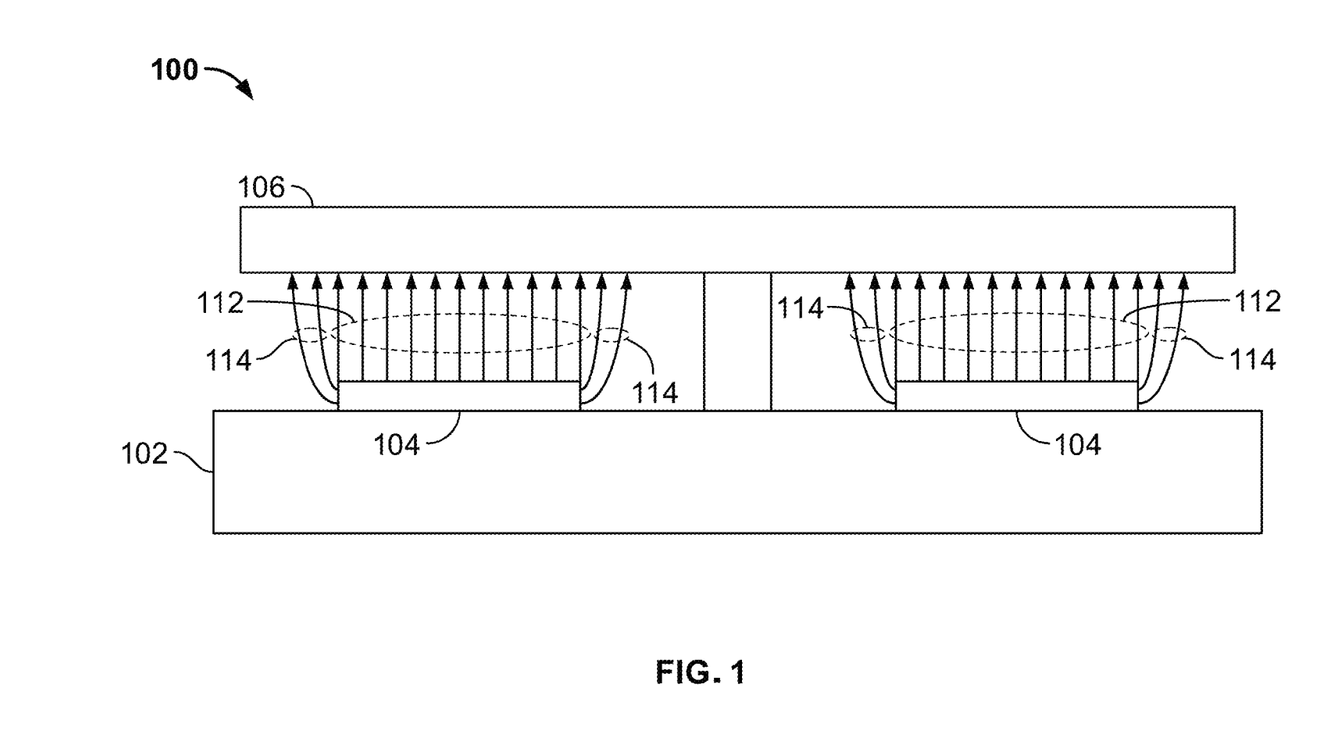
FIG. 1 shows an exemplary depiction of a simplified micro-electromechanical system (MEMS) out-of-plane accelerometer in accordance with some embodiments of the present disclosure.

FIG. 1 shows an exemplary depiction of a simplified MEMS out-of-plane accelerometer in accordance with some embodiments of the present disclosure. An exemplary MEMS device is an accelerometer that is configured to detect linear acceleration in a particular out of plane direction (e.g., along the z-axis). Although it will be understood that the present disclosure is applicable to any suitable capacitive sensing MEMS sensor (e.g., accelerometer, gyroscope, pressure sensor, etc.) in any suitable configuration, an exemplary simplified accelerometer of FIG. 1 is depicted as including fixed sense electrodes 104 that are attached to a substrate layer 102, and a proof mass 106 located within a MEMS layer and supported by the substrate layer 102 via an anchor. The fixed sense electrodes 104 and the proof mass 106, which functions as a capacitive plate, form a capacitor that in turn is used to sense movement of the proof mass 106 relative to the fixed sense electrodes 104, with changes in capacitance corresponding to movement in response to linear acceleration. In this depiction of the out-of-plane linear accelerometer 100, electric fields of the capacitors formed by proof mass 106 and fixed electrodes 104 are depicted as capacitive sensing fields 112 and fringe fields 114 between the fixed sense electrodes 104 and the proof mass 106. Although this is described in the context of a simplified accelerometer, any other MEMS sensor that uses capacitive sensing would be a suitable example (e.g., gyroscope, pressure sensor, microphone, etc.). Although FIG. 1 is an exemplary simplified linear accelerometer, there are different variations of capacitive MEMS sensors that are suitable and will have different designs that do not have fixed electrodes bonded directly on a substrate layer. For example, a fixed sense electrode may extend into the MEMS plane where the proof mass is located such as for in-plane sensing.

The substrate layer 102 of the silicon wafer provides a flat, semiconductor surface for layers to be created throughout as well as attached thereto. A variety of components may be mounted onto the substrate layer 102 and different layers of integrated circuits may be located within the wafer, e.g., utilizing CMOS technology. The substrate layer 102 may provide a surface for physical and/or electrical connections to other components and devices of an end-use product. As will be understood, a typical MEMS sensor will be partially or fully encapsulated within a cap, which is not depicted in FIG. 1.

The fixed sense electrodes 104 are conductive electrodes that couple to a signal source and/or circuitry for sensing capacitance. The fixed sense electrodes interact electrically with the moveable parallel proof mass 106, which functions as a capacitive plate. The capacitor(s) formed between proof mass 106 and electrodes 104 have a positive potential difference that will cause electric fields, including fringe fields, to occur between each sense electrode 104 and the moveable proof mass 106. The capacitance represented by capacitive sensing fields 112 between the fixed sense electrodes 104 and the proof mass 106 are proportional to the movement of the proof mass. In out-of-plane accelerometer 100, the fixed sense electrodes 104 and/or proof mass 106 are coupled to sense circuitry for determination of a parameter (e.g., acceleration) of interest based on changes in capacitance.

In this simplified out-of-plane accelerometer, the parallel proof mass 106 is moves along the z-axis towards or away from the fixed sense electrodes 104 when there is a linear acceleration along the z-axis exerted on the sensor 100. This causes changes in capacitance based on changes in the electric fields between the proof mass 106 and the fixed sense electrodes 104. The capacitance signals measured by the accelerometer includes both the capacitive sensing fields 112 and the fringe fields 114. The proof mass 106 is designed such that different portions of the proof mass 106 move differentially with respect to respective associated fixed electrodes 104. This will bring one side of the moveable proof mass 106 closer to its partnering fixed electrode 104. This change in gap will cause a change in capacitance, which is processed by sensing circuitry of processing circuitry of the accelerometer 100.

Processing circuitry of accelerometer 100, or any other capacitive sensing MEMS sensor (e.g., a MEMS gyroscope, pressure sensor, microphone, etc.) may include one or more components providing necessary processing based on the requirements of the MEMS sensor. In some embodiments, processing circuitry may include hardware control logic that may be integrated within a chip of a sensor (e.g., on a substrate or capacitor of a MEMS sensor or on an adjacent portion of a chip to the MEMS sensor 102 or other sensor) to control the operation of the MEMS sensor and perform aspects of processing for the MEMS sensor. In some embodiments, the MEMS sensor may include one or more registers that allow aspects of the operation of hardware control logic to be modified (e.g., by modifying a value of a register). In some embodiments, processing circuitry may also include a processor such as microprocessor that executes software instructions, e.g., that are stored in local or connected memory. The microprocessor may control the operation of the MEMS sensor by interacting with the hardware control logic, and process signals received from MEMS sensor. The microprocessor may interact with other sensors in a similar manner. In some embodiments, some or all of the functions of the processing circuitry, and in some embodiments, of memory, may be implemented on an application specific integrated circuit ("ASIC") and/or a field programmable gate array ("FPGA"). Although in some embodiments, the MEMS sensor may communicate directly with external circuitry (e.g., via a serial bus or direct connection to sensor outputs and control inputs), in an embodiment the processing circuitry may process data received from the MEMS sensor and communicate with external components via a communication interface (e.g., a SPI or I2C bus, in automotive applications a controller area network (CAN) or Local Interconnect Network (LIN) bus, or in other applications suitable wired or wireless communications interfaces as is known in the art). The processing circuitry may convert signals received from the MEMS sensor into appropriate measurement units (e.g., based on settings provided by other computing units communicating over the communication bus) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS sensor, in accordance with information such as scaling or compensation factors provided to the processing circuitry, e.g., during manufacturing testing as described herein.

The capacitive sensing fields 112 form between the moveable parallel proof mass 106 and the fixed sense electrodes 104. The capacitive sensing fields 112 are directly between the proof mass 106 and the sense electrodes 104 and change in proportion to the distance between the proof mass 106 and the sense electrodes 104 in a predictable manner. In this exemplary MEMS device 100, one of the fixed sense electrodes 104 or the proof mass 106 is coupled to a signal source (e.g., a periodic drive or carrier signal) while the other is coupled to sense circuitry, such that the capacitance corresponding to the electric fields between the fixed sense electrodes 104 and the proof mass 106 can be measured.

The fringe fields 114 are formed from the proof mass 106 and portions of the fixed sense electrode 104 that do not directly face the opposite parallel plate. The fringe fields 114 do contribute to the capacitance measured, however the fringe fields 114 are difficult to accurately predict by simulation and affect the capacitive sensing fields 112. The fringe fields will come in different forms, depending on how the capacitive plates of the proof mass, and the sense electrodes, are shaped, sized and positioned. Accordingly, the fringe fields 114 can create inaccuracies in the capacitance measurement calculations as the measured capacitance will not match the expected capacitance based on the distance between the proof mass 106 and the sense electrodes 104.

Figure 2:
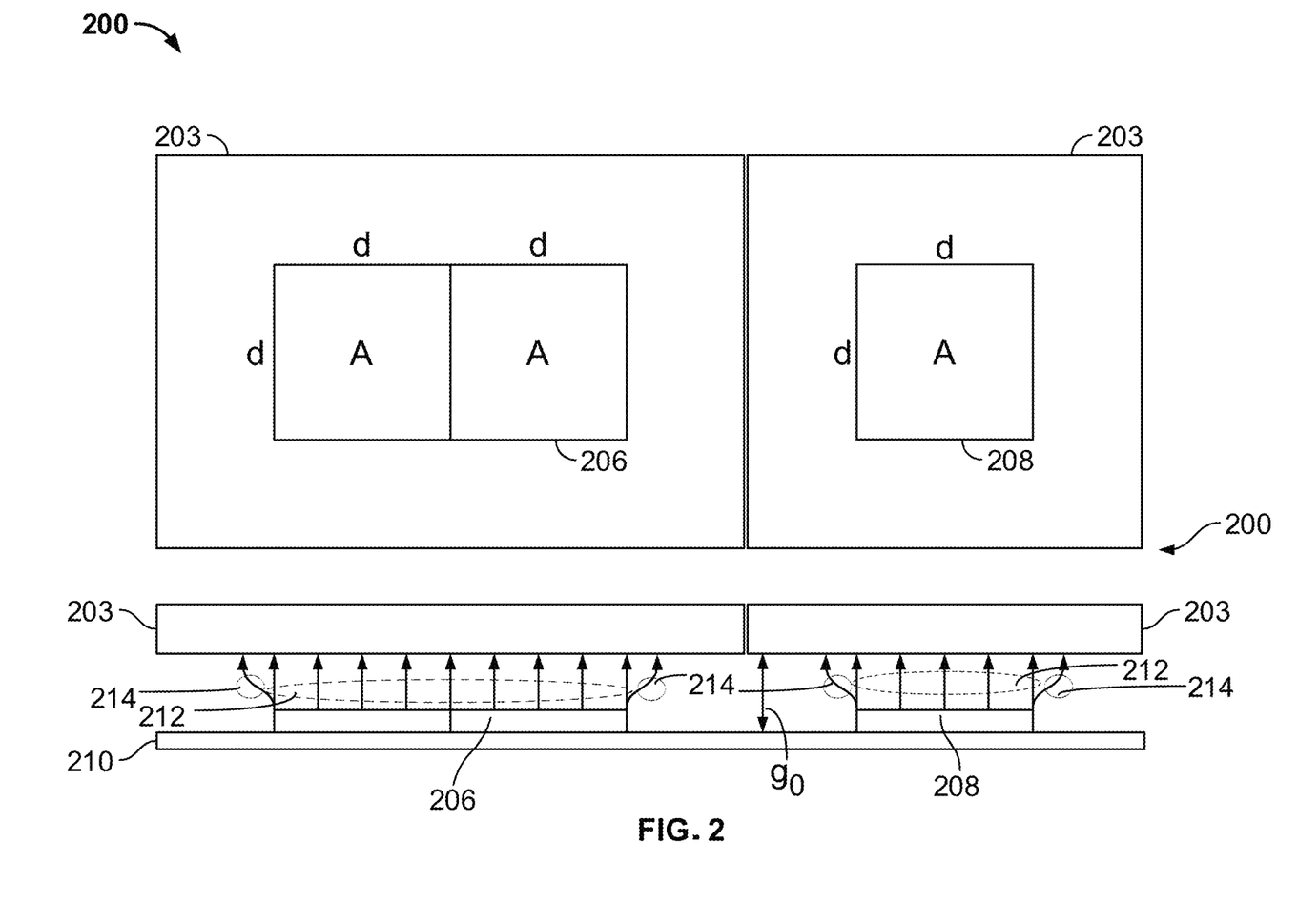
FIG. 2 shows an illustrative test structure for capacitive MEMS devices in accordance with some embodiments of the present disclosure.

FIG. 2 shows an illustrative test structure for capacitive MEMS devices in accordance with some embodiments of the present disclosure. As described herein, a test structure may be fabricated with a production run of MEMS sensors but may not be integral to the MEMS sensors, for example, occupying a portion of a production wafer including multiple MEMS sensors. In this manner, the gaps measured within the test structure are representative of the gaps for the MEMS sensors within the same wafer. In some embodiments, a test structure may only be included on a subset of wafers, for example, for particular batches, after tool changes, and the like. In other embodiments, a test structure may be included on a die with one or more MEMS sensors, such that testing and measurements performed by the test structure may be performed during the lifetime of the MEMS sensor(s).

This test structure 200 may be comprised of a capacitive plate 203, a first sense electrode 206, a second sense electrode 208, and a base substrate layer 210. The test structures can also take many different variations in order to best correspond to the MEMS capacitive devices that are being tested, for example to correspond to the size, shape, and configuration of the MEMS capacitive devices. Accordingly, the positioning, size, shape and number of capacitive plates and sense electrodes may vary from those depicted herein.

The capacitive plate 203 above the sense electrodes 206, 208 is located within a MEMS layer (e.g., corresponding to the MEMS layer of MEMS capacitive sensors sharing a wafer with the test structure 100) and form one portion of the capacitors of this exemplary test structure 200. One of the capacitive plate 203 or sense electrodes 206/208 are provided a signal similar to a corresponding drive/carrier signal of the are MEMS capacitive devices, to properly simulate the capacitors formed by the MEMS capacitive devices, while the other of the capacitive plate 203 or sense electrodes 206/208 are coupled to sense circuitry of the test structure (e.g., including processing circuitry such as a C2V converter, or in some embodiments directly wired to external processing circuitry, etc.), not specifically depicted in FIG. 2. The exemplary test structure 200 may also function without a drive/carrier signal, but instead with a static electric potential between the capacitive plate 203 and the sense electrodes 206/208. There will be electric fields between the capacitive plate 203 and the fixed sense electrodes 206, 208, including capacitive sensing fields 212 and fringe fields 214. The design of the test structure 200 is performed in a manner to minimize local variations of the gap along the capacitive plate 203 (e.g., with secure anchors physically connected to the substrate layer 210 and the capacitive plate 203). Although multiple capacitive plates are depicted in FIG. 2, it will be understood that a single capacitive plate can be used so long as the associated sense electrodes are electrically isolated. A single plate embodiment may further ensure that the gap associated with the respective capacitors is identical. The sense circuitry for each of the respective capacitors is physically separated and may be electrically shielded to prevent cross-talk of between the respective sense signals.

The first fixed sense electrode's 206 shape and size define the first sense electrode area and the first sense electrode perimeter. In this exemplary test structure 200, the first sense electrode 206 has a rectangular shape and corresponds to two squares of the second sense electrode 208, where the area ratio of the first sense electrode 206 to the second sense electrode 208 is 2:1. The perimeter ratio of the first sense electrode 206 to the second sense electrode 208 will be 3:2. The area ratio corresponds to portions of the respective capacitors in which the electric fields formed by the capacitors are represented by capacitive sensing fields 212, whereas the perimeter ratio corresponds to edges of the respective capacitors in which the electric fields formed by the capacitors are represented by fringe fields 214.

Although this exemplary test structure 200 depicts a first and second sense electrode pair 206/208, there are many other ways to design the test structure 200 and the first and second sense electrode's 206/208 size and shape. However, both the area ratio and perimeter ratio between the first sense electrode 206 and the second sense electrode 208 should be known or measurable. This is important in order to use the test structure 200 to determine an accurate gap measurement ($g_0$) between the capacitive plate 203 and the electrodes 206/208, and to determine appropriate value for fringe field compensation in accordance with the present disclosure.

The test structure 200 illustrated in FIG. 2 is bonded on a die on top of a base substrate 210 layer of a processing wafer, e.g., a wafer including multiple MEMS capacitive devices such as sensors with a shared MEMS layer with the capacitive plate 203 of the test structure 200. The first and second sense electrodes 206/208 are mounted on top of substrate 210 and the capacitive plate 203 is connected to substrate 210 via anchors (not depicted). In some embodiments, the substrate layer 210 may include processing circuitry such as sensing circuitry and/or additional processing circuitry as described herein, such in a as a complementary metal-oxide-semiconductor (CMOS) substrate layer 210.

The respective contributions of the capacitive sensing fields 212 and the fringe fields 214 to the sensed capacitance of each of the capacitors is based on the respective sense areas (e.g., corresponding to the capacitive sensing fields 212) and perimeters (e.g., corresponding to the fringe fields 214) for each capacitor. Because these values are known based on the design of the test structure, and because the test structure 200 is designed such that the capacitive gap g0 is substantially identical for both capacitors and to prevent other effects interfering with the capacitors (e.g., overlap or interference with fringe fields, crosstalk of measured capacitance signals), the measured capacitances correspond to the following:

$$C_1 = \frac{\epsilon_0 2A}{g_0} + \phi(6d) \qquad (1)$$

$$C_2 = \frac{\epsilon_0 A}{g_0} + \phi(4d) \qquad (2)$$

In equations (1) and (2) above, $\epsilon_0$ corresponds to the permittivity of the transmission medium for the capacitors, A to the area of the second sense electrode 208, d to the length of each edge of second sense electrode 208, $C_1$ to the capacitance measurement of the first capacitor of area 2A, $C_2$ to the capacitance measurement of the second capacitor of area A, $\phi$ to the capacitance contribution of the fringe fields, and $g_0$ to the gap between the respective sense electrodes and the capacitive plates. The capacitance contribution of the fringe fields $\phi$ is a function of the perimeter of a capacitor. In the embodiment of FIG. 2, based on the known dimensions of the test structure, these equations can be rewritten as follows, such that once the respective capacitances are measured there are only two unknowns, corresponding to the gap distance $g_0$ and fringe field ff.

$$C_1 = \frac{\epsilon_0 2d * d}{g_0} + \left(\frac{\Pi_1}{\Pi_2}\right) * ff \qquad (3)$$

$$C_2 = \frac{\epsilon_0 d * d}{g_0} + ff \qquad (4)$$

In equations (3) and (4) above, ff corresponds to the overall fringe field contribution to the capacitor formed with second sense electrode 208, $\Pi_1$ corresponds to the perimeter of first sense electrode 206, and $\Pi_2$ corresponds to the perimeter of the second sense electrode 208. The overall fringe field contribution ff is scaled by a function of the two perimeters ($\Pi_1$, $\Pi_2$), wherein the function is equivalent to the ratio of the perimeters. Based on capacitances measured with the test structure 200 and known values, the gap $g_0$ and fringe field ff can be determined, e.g., for a wafer of MEMS devices. These values in turn can be used to set values such as scaling and offset values for the MEMS devices located on the same wafer, same batch of wafers, or the like. In embodiments where a test structure is associated with each MEMS device (e.g., is included within a common die with each end-use MEMS device), the test capacitances can be measured over the lifetime of the device, such that scaling and offset can be periodically or continuously updated, for example, to compensate for typical wear in the MEMS device components over time or changes in environmental characteristics (e.g., temperature) that impact measured capacitance.

The capacitance measurements in end-use MEMS devices may be more accurately measured with the scaling and offset values despite variations within standards semiconductor fabrication processes. By determining the fringe field associated with the MEMS test structure, an offset may be determined for a similarly configured MEMS device that are similar to the MEMS test structure to remove the fringe field from measurements of the MEMS device. The determined gap may be used to perform appropriate scaling for the MEMS device, which will aid in the estimation of the gap and fringe field values of the MEMS device that are in the same prime die as the test structure.

Figure 3:
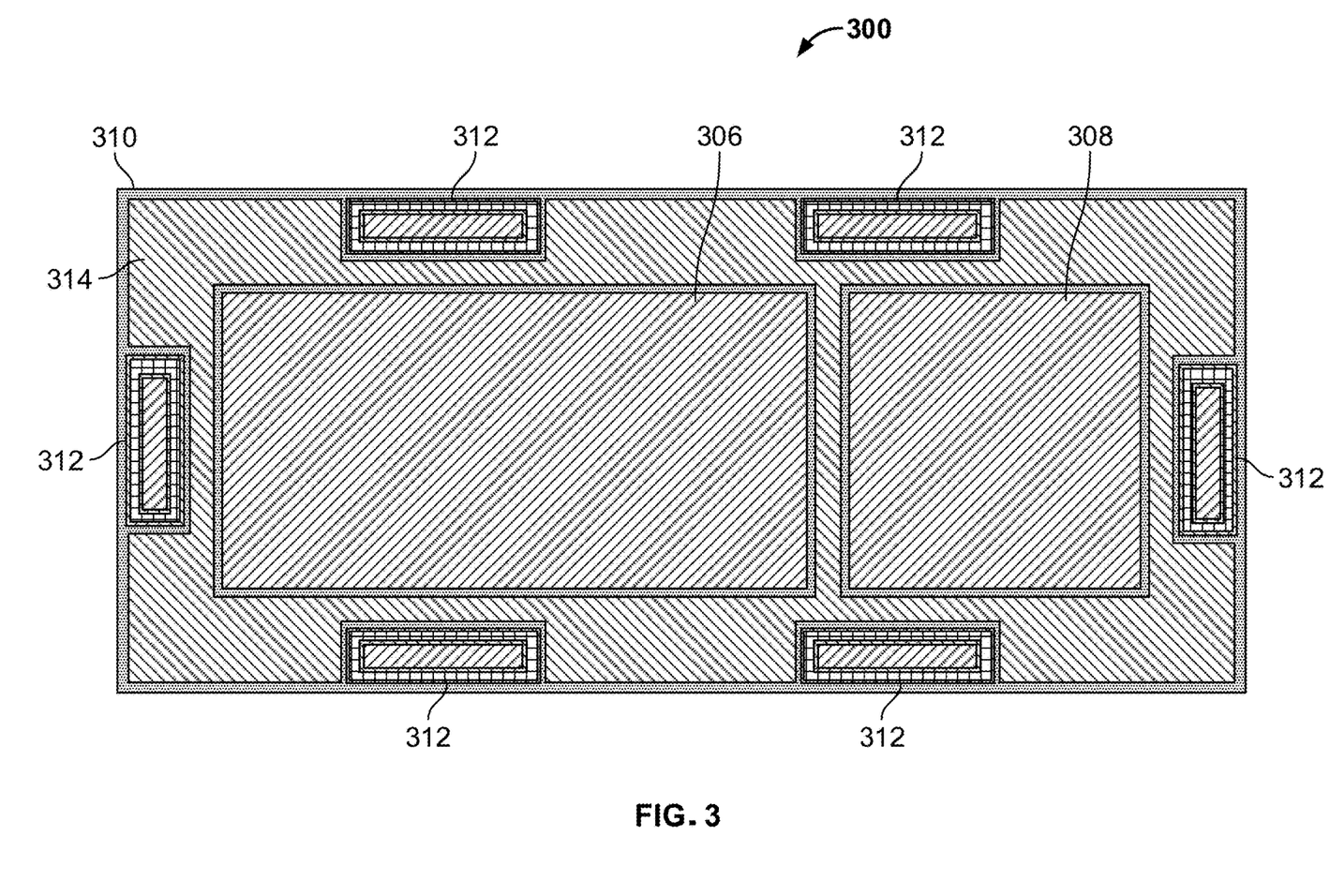
FIG. 3 shows an exemplary physical layout of a MEMS test structure with a plurality of anchors and surrounding shielding metal in accordance with the present disclosure.

FIG. 3 shows an exemplary physical layout of a MEMS test structure with a plurality of anchors and surrounding shielding metal in accordance with the present disclosure. In MEMS devices, including this test structure 300, there are different ways for the device to be fabricated on a wafer, and eventually separated into dies, including the various electromechanically layers, internal processing circuitry, complete and partial encapsulation, physical interconnections to external components, and electrical connections to external components. In exemplary MEMS device, the device includes a substrate layer (e.g., including processing circuitry such as sensing circuitry and physical can electrical connections to external components, as well sense electrodes deposited thereon), a MEMS layer including structures such as a diaphragm or suspended spring-mass system, and a cap layer providing partial or complete encapsulation of the MEMS structures. It will be understood that other configurations may be utilized based on the sensor type and/or fabrication techniques for the sensor, for example, a MEMS microphone including an access port through a substrate and an ASIC located within the volume defined by the cap. However, the MEMS device is fabricated and configured, the layers of the sensor are interconnected such as through eutectic bonds, and the movable components of the MEMS device within the MEMS layer are designed to be located at a particular distance from sense electrodes (in-plane or out of plane) and restricted to movement in particular directions. The respective location of the movable MEMS components may be set, at least in part, based on anchors that extend between the substrate and/or cap and the MEMS layer, providing support and locating the movable MEMS components with respect to the other sensor components. FIG. 3 depicts an exemplary anchoring configuration for a MEMS test structure located on a wafer with MEMS devices, e.g., corresponding to the square and rectangular MEMS test structure of FIG. 2. The anchoring configuration may provide robust support for the capacitive plates, such that their location within the MEMS layer corresponds to the location of movable MEMS components within the MEMS devices co-located on the wafer. The exemplary anchoring configuration of the test structure 300 depicted in FIG. 3 shows the locations of a first sense electrode 306, second sense electrode 308, a plurality of anchors 312 within the substrate layer 310, and a surrounding shielding metal 314 that is coupled to ground.

The plurality of anchors 312 are used to support the capacitive plate (not depicted in FIG. 3) above the first and second sense electrodes 306 and 308. These anchors 312 are mounted to the substrate and are physically attach between the substrate 310 and the capacitive plate (not depicted in FIG. 3), providing support for the capacitive plate and precisely locating the capacitive plate with respect to the sense electrodes 306/308 to provide a precise and consistent gap therebetween. The plurality of anchors 312 are positioned at an adequate distance with respect to the sense electrodes 306/308 such that they do not interfere with the electric fields formed by the respective capacitors.

The shielding metal 314 surrounds the two capacitors formed by the capacitive plate (not depicted in FIG. 3) and the first and second sense electrodes 306 and 308, as well as the plurality of anchors 312. This surrounding shielding metal 314 is electrically coupled to ground and is used to avoid distortions in the fields formed between the capacitors by way of isolating the lower metal layers from the capacitors on the substrate layer 310.

Figure 4:
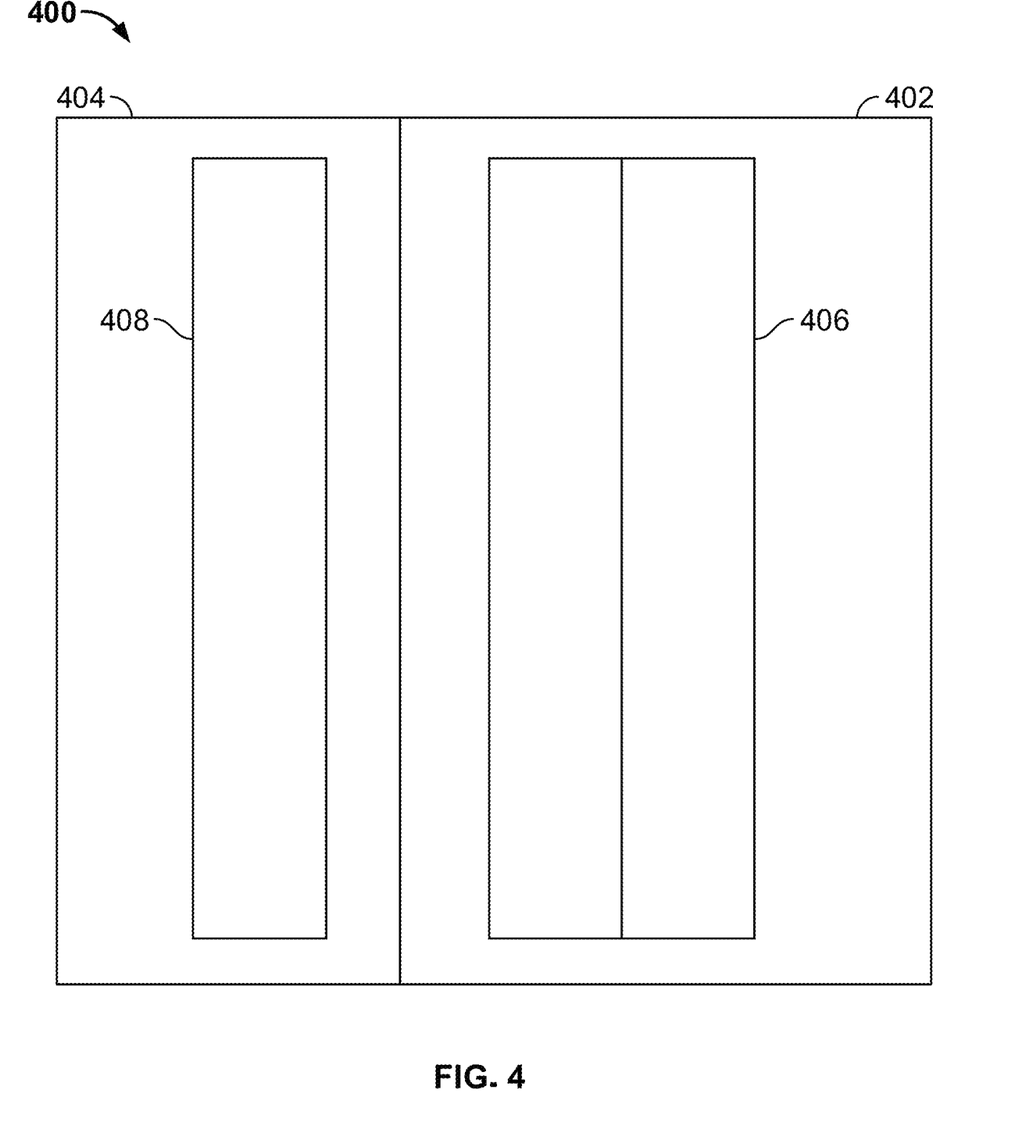
FIG. 4 shows an exemplary depiction of a MEMS test structure sense electrode configuration in accordance with the present disclosure.

FIG. 4 shows an exemplary depiction of a MEMS test structure sense electrode configuration in accordance with the present disclosure. This embodiment of a test structure 400 is comprised of a first fixed sense electrode 406 that is paired with a first capacitive plate 402, as well as a second fixed sense electrode 408 that is paired with a second capacitive plate 404. Similar to other example test structures described herein, both electrode-capacitive plate pairs form a respective capacitor once an electrical signal is applied between each first sense electrode 406 and first capacitive plate 402 and between second sense electrode 408 and second capacitive plate 408. In the exemplary embodiment of FIG. 4, a different form factor of the sense electrodes is depicted, for example, to better correspond to a particular sense electrode shape of a MEMS device associated with the test structure 400.

In exemplary test structure 400, the first sense electrode 406 has a rectangular shape and corresponds to two rectangles of the second sense electrode 408, where the area ratio of the first sense electrode 406 to the second sense electrode 408 is still 2:1, just as it was in test structure 200. However, in this test structure, the perimeter ratio will be closer to 1:1 as compared to the test structure 200, for example, 1.25:1. The first sense electrode 406 and second sense electrode 408 are located on an upper surface of the substrate (not depicted) and coupled to a signal source and/or sensing circuitry in order to measure capacitance with respective capacitors formed with corresponding capacitive plates 402 and 404. The first sense electrode 406 will form a capacitor with the first capacitive plate 402, wherein an electric potential difference between the first sense electrode 406 and the capacitive plate 404 will form capacitive sensing and fringing electric fields between them. The second sense electrode 408 will form a capacitor with the second capacitive plate 404, wherein an electric potential difference between the second sense electrode 408 and the capacitive plate 404 will form electric fields between them.

The elongated rectangular shape of the sense electrodes 406 and/or 408 may correspond to a sense electrode shape of associated MEMS device, for example, on a shared die, shared wafer, or a batch of wafers. Equations (1)-(4) may be modified based on the respective area and perimeter values of the sense electrodes of the test structure, such that a gap and fringe field effect may be calculated based on measured capacitances. Scaling and offset factors for the associated MEMS devices may in turn be selected based on the calculated gap and fringe field effects, which may be simplified by selecting test structure sense electrode shapes that closely correspond to the MEMS device sense electrode shapes (e.g., such that a perimeter and shape are identical or similar, allowing for direct translation of the fringe field effect to the associated MEMS device). In a similar manner to that described for FIG. 4, accurate scaling and offset values can be derived for suitable sense electrode configurations of a MEMS device that is similar to the test structure, by configuring identical or similarly proportioned sense electrodes for test structures, modifying equations (1)-(4) based on the particular geometries, and utilizing the resulting gap and fringe field outputs to set the scaling and/or offset values.

Figure 5:
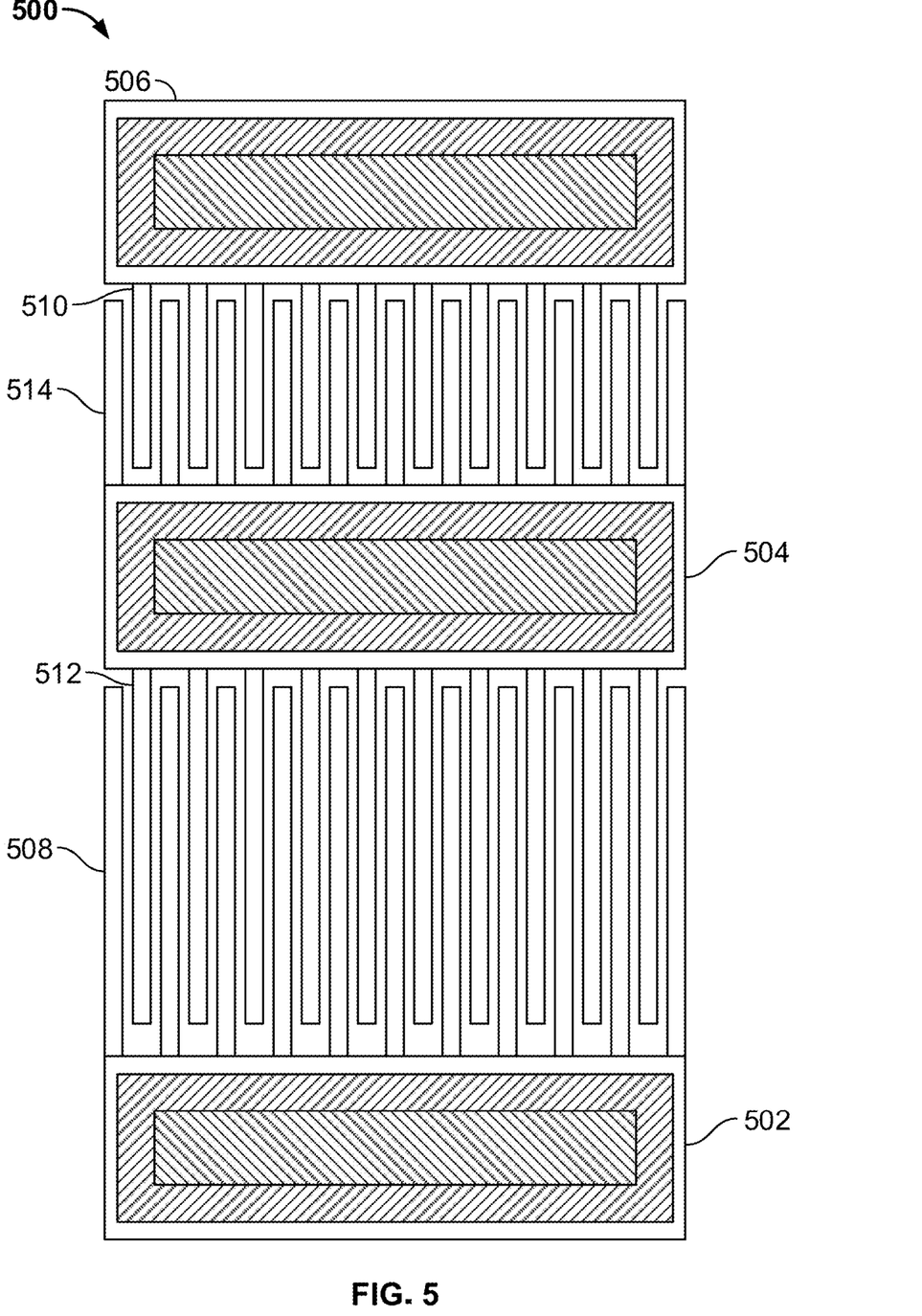
FIG. 5 shows an exemplary depiction of a test structure with parallel plates for in-plane testing in accordance with the present disclosure.

FIG. 5 shows an exemplary depiction of a test structure with parallel plates for in-plane testing in accordance with the present disclosure. In addition to accommodating any suitable geometry of out-of-plane sensing test electrodes (e.g., located on a substrate of a MEMS device), the present disclosure can also be utilized to create test structures for in-plane sensing MEMS devices (e.g., with fixed sense electrodes extending into the MEMS layer, to sense relative in-plane movement of proof masses). Exemplary test structure 500 is used for MEMS devices that use an in-plane comb structure or an array of parallel plates for sensing. Test structure 500 includes a first and second anchor 502, 506, a fixed test mass 504, first and second series of parallel sense electrodes 508, 510, and a first and second series of capacitive plates 512, 514.

The first and second anchors 502, 506 are set to hold plates of different length. Similar to test structure 200 and test structure 400, this test structure will have two sides, where one series of parallel sense electrodes will have lengths that are a scalar multiple of the other series of parallel sense electrodes. The first anchor 502 is physically and electrically bonded with the first series of parallel sense electrodes 508, while the second anchor 506 is physically and electrically bonded to the second series of parallel sense electrodes 510. The fixed test mass 504 is physically and electrically bonded to both the first series of capacitive plates 512 and the second series of capacitive plates 514. The fixed test mass 504 sits between the anchors 502, 506, such that the combs extending therebetween are equally spaced.

The first series of parallel sense electrodes 508 is similar to the fixed electrodes in other test structures. They are conductive electrodes that form one part of the multiple parallel capacitors with the first series of capacitive plates 512, that collectively generate an overall capacitive signal that is measured by sense circuitry (not depicted) of test structure 500. For example, sense circuitry may be located within a substrate layer of the test structure 500 and may be electrically connected to anchor 502 to measure the capacitance generated between parallel sense electrodes 508 and capacitive plates 512. The overall capacitance sensed between parallel sense electrodes 508 and capacitive plates 512 will correspond to capacitive sensing fields directly in-plane between the interdigitated comb fingers as well as out-of-plane fringe fields, such as is described in more detail in FIG. 7 herein. In a similar manner, separate sense circuitry (e.g., physically separate and electrically shielded) may be located within a substrate layer of the test structure 500 and may be electrically connected to anchor 562 to measure the capacitance generated between parallel sense electrodes 510 and capacitive plates 514.

Figure 6:
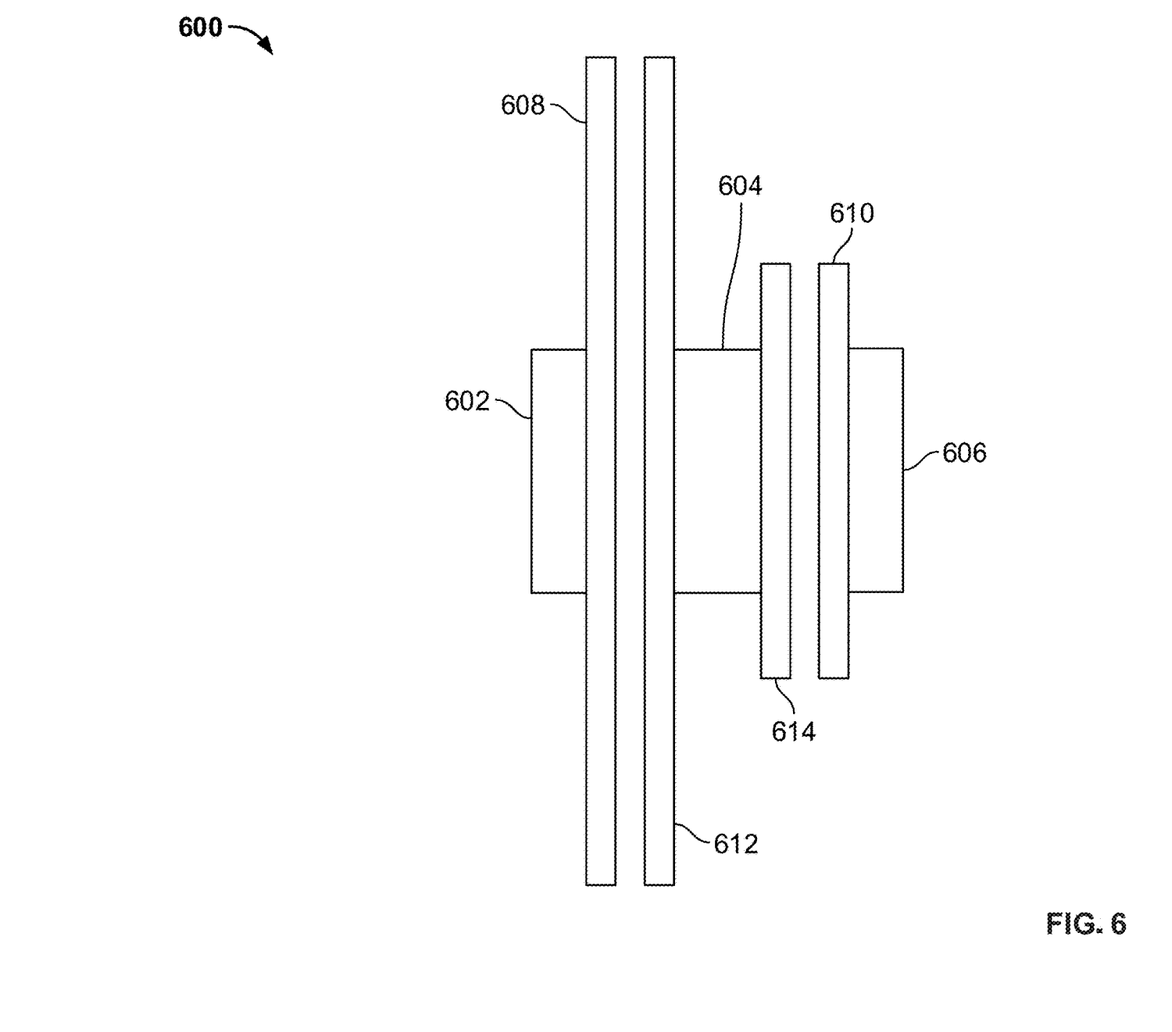
FIG. 6 shows an exemplary section of an in-plane test structure in accordance with the present disclosure.

FIG. 6 shows an exemplary section of an in-plane test structure in accordance with the present disclosure. This test structure 600 is comprised of a first and a second anchor 602, 606, a fixed test mass 604, and a first and a second set of parallel plates 608, 610. The embodiment of FIG. 6 corresponds to a test structure 600 simulating a configuration of parallel plates for in-plane sensing in a MEMS device.

The first and second anchors 602, 606 are set to hold plates of different length. Similar to other test structures described herein, the test structure of FIG. 6 includes two portions, where one series of parallel sense electrodes will have lengths that are a scalar multiple of the other series of parallel sense electrodes. The first anchor 602 is physically and electrically bonded with first parallel sense electrode 608, while the second anchor 606 is physically and electrically bonded to the first parallel sense electrode 610. The fixed test mass 606 is physically and electrically bonded to both the first capacitive plate 612 and the second capacitive plates 614. The fixed test mass 604 sits between the anchors 602, 606, such that the combs extending therebetween are equally spaced.

The sense electrode 608 is similar to the fixed electrodes in other test structures. They are conductive electrodes that form one part of the multiple parallel capacitors with the first series of capacitive plate 612, that collectively generate an overall capacitive signal that is measured by sense circuitry (not depicted) of test structure 600. For example, sense circuitry may be located within a substrate layer of the test structure 600 and may be electrically connected to anchor 602 to measure the capacitance generated between parallel sense electrodes 608 and capacitive plates 612. The overall capacitance sensed between parallel sense electrodes 608 and capacitive plates 612 will correspond to capacitive sensing fields directly in-plane between the interdigitated comb fingers as well as out-of-plane fringe fields, such as is described in more detail in FIG. 7 herein. In a similar manner, separate sense circuitry (e.g., physically separate and electrically shielded) may be located within a substrate layer of the test structure 600 and may be electrically connected to anchor 606 to measure the capacitance generated between parallel sense electrode 610 and capacitive plate 614.

Figure 7A:
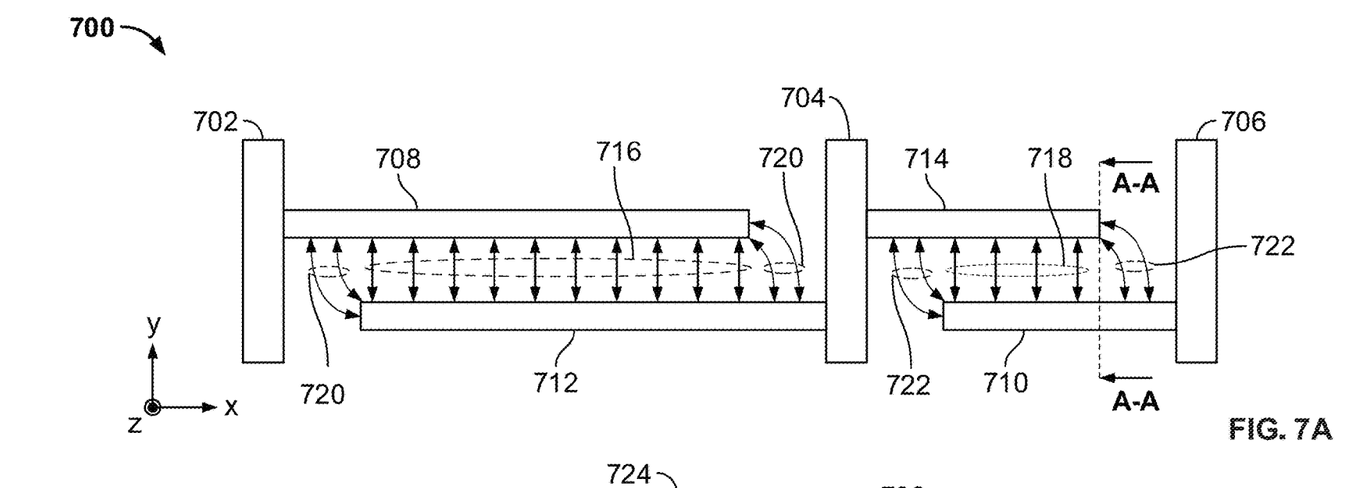
FIG. 7A shows an exemplary depiction of an in-plane test structure in accordance with the present disclosure.

FIG. 7A shows an exemplary depiction of an in-plane test structure in accordance with the present disclosure. The exemplary in-plane test structure 700 includes first anchor 702, fixed test mass 704, second anchor 706, sense electrode 708 coupled to anchor 702, sense electrode 710 coupled to anchor 706, capacitive plate 712 coupled to fixed test mass 704 and associated with sense electrode 708, and capacitive plate 714 coupled to fixed test mass 704 and associated with sense electrode 710. FIG. 7 also depicts electric fields associated with exemplary in-plane test structure 700, including capacitive sensing fields 716 associated with a capacitor formed between sense electrode 708 and capacitive plate 712, capacitive sensing fields 718 associated with a capacitor formed between sense electrode 710 and capacitive plate 714, in-plane fringe fields 720 associated with the capacitor formed between sense electrode 708 and capacitive plate 712, and in-plane fringe fields 722 associated with the capacitor formed between sense electrode 710 and capacitive plate 714.

Figure 7B:
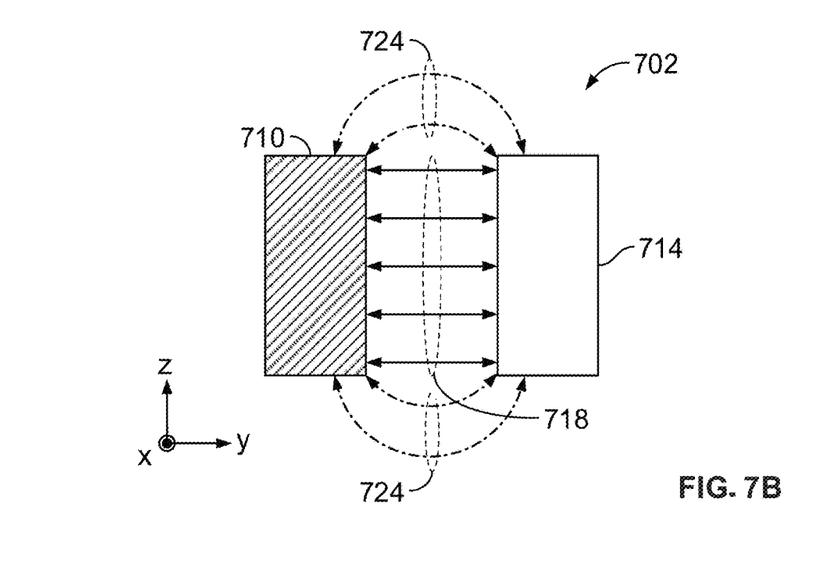
FIG. 7B shows an exemplary side view of two parallel plates of an in-plane test structure in accordance with the present disclosure.

FIG. 7B shows an exemplary side view of two parallel plates of the in-plane test structure of FIG. 7A along section line A-A in accordance with the present disclosure. As depicted in FIG. 7B, out-of-plane fringe fields 724 are associated with the capacitor formed between sense electrode 710 and capacitive plate 714. It will be understood that out-of-plane fringe fields associated with the capacitor formed between sense electrode 708 and capacitive plate 714 will be similar to the out-of-plane fringe fields 724, except that they may extend along the different length of the overlap between sense electrode 708 and capacitive plate 714.

As in other embodiments described herein, the exemplary test structure depicted in FIGS. 7A and 7B has components scaled in a known manner, such that the respective capacitors formed thereby have similar dimensions to allow for calculation of a capacitive gap (or in embodiments with multiple in-plane parallel plates such as a comb structure, an average capacitive gap) and fringe field contributions. Similar to the description of an out-of-plane test structure, the relationships and calculations described with respect to FIGS. 7A and 7B can be adjusted for different sizes, shapes, and geometries.

Three types of electric fields contribute to the respective capacitances sensed of the capacitor formed between sense electrode 708 and capacitive plate 712 and the capacitor formed between sense electrode 710 and capacitive plate 714. Capacitive sensing fields 716 and 718 correspond to the in-plane electric fields between electrode faces in the x-z plane, which are desirable for accurate measurement of in-plane electrode movement in associated MEMS devices. In-plane fringing fields 720 and 722 correspond to electric fields between y-z plane edge faces of respective electrode and x-z plane faces of adjacent electrodes and may be relatively unpredictable for capacitive sensing. Out-of-plane fringing field 724 and the undepicted out-of-plane fringing field associated with sense electrode 708 and capacitive plate 712 correspond to electric fields between respective top x-y plane faces of adjacent electrodes and respective bottom x-y plane faces of the same adjacent electrodes, as depicted by out-of-plane fringing field 724 for top and bottom x-y plane faces of sense electrode 710 and capacitive plate 714 in FIG. 7B.

To simplify the respective geometries and associated calculations, in the embodiment of FIGS. 7A and 7B the z-axis height and y-axis width of each of sense electrode 708, sense electrode 710, capacitive plate 712, and capacitive plate 714 are identical, although it will be understood that different heights and widths may be utilized in different embodiments by adjusting calculations described herein. In this manner, the respective capacitive fields 716 and 718 are similar, except that a difference between the capacitances formed thereby is proportional to the respective x-axis lengths of the overlap between sense electrode 708 and capacitive plate 712 and the overlap between sense electrode 710 and capacitive plate 714. In a similar manner, because the y-axis width of each of sense electrode 708, sense electrode 710, capacitive plate 712, and capacitive plate 714 are identical, the contribution to the overall capacitance of out-of-plane fringe field 724 between sense electrode 710 and capacitive plate 714 will be proportional to the contribution of the out-of-plane fringe field (not depicted) between sense electrode 708 and capacitive plate 712, based on the respective x-axis overlap lengths of the respective capacitors formed thereby.

In an exemplary embodiment where the x-axis length of the overlap between sense electrode 708 and capacitive plate 712 is twice the x-axis length of the overlap of sense electrode 710 and capacitive plate 714, the overall capacitance of a capacitor "$C_1$" formed between sense electrode 708 and capacitive plate 712 and the overall capacitance of a capacitor "$C_2$" formed between sense electrode 710 and capacitive plate 714 may be determined as follows:

$$C_1 = \frac{2\epsilon_0 A_1 N}{g_0} + C_{1,ff} + C_{tip} \quad (5)$$

$$C_2 = \frac{2\epsilon_0 A_2 N}{g_0} + C_{2,ff} + C_{tip} \quad (6)$$

In equations (5) and (6) above, $\epsilon_0$ corresponds to the vacuum permittivity of the transmission medium for the capacitors, $A_1$ to the area of the overlap between the sense electrode 708 and capacitive plate 712, $A_2$ to the area of the overlap between the sense electrode 710 and capacitive plate 714, $g_0$ to the gap between the respective sense electrodes and the capacitive plates, N to the number of comb pairs in the in-plane structure (e.g., 1 in FIGS. 7A and 7B), $C_{1,ff}$ to the out-of-plane fringe field (not depicted) between electrode 708 and capacitive plate 712, $C_{2,ff}$ to the out-of-plane fringe field 724 between electrode 710 and capacitive plate 714, and $C_{tip}$ to the n-plane fringe fields at the electrode tips (e.g., in-plane fringing fields 720 and 722). Based on the known relationships of $A_1 = 2A_2$ and $C_{1,ff} = 2C_{2,ff}$, equations (5) and (6) may be further simplified to solve for the gap $g_0$ and the total fringing field contributions, for example, using a second structure with a different gap and/or obtaining a relation between $g_0$ and $C_{2,ff}$ based on simulations.

Based on capacitances measured with the test structure 700 and known values, the gap $g_0$ and fringe field ff can be determined, e.g., for a wafer of in-plane sensing MEMS devices. These values in turn can be used to set values such as scaling and offset values for the MEMS devices located on the same wafer, same batch of wafers, or the like. In embodiments where a test structure is associated with each MEMS device (e.g., is included within a common die with each end-use MEMS device), the test capacitances can be measured over the lifetime of the device, such that scaling and offset can be periodically or continuously updated, for example, to compensate for typical wear in the MEMS device components over time or changes in environmental characteristics (e.g., temperature) that impact measured capacitance.

The scaling and offset values can be set based on known geometric relationships between the sense electrodes of the test structure and the sense electrodes of the MEMS devices. In this manner, capacitance measurements in end-use MEMS devices may be more accurately measured despite variations within standards semiconductor fabrication processes. By determining the fringe field associated with the MEMS test structure, an offset may be determined for a similarly configured MEMS device to remove the fringe field from measurements of the MEMS device. The determined gap may be used to perform appropriate scaling for the MEMS device, based on the actual determined gap as compared to a designed gap for the particular MEMS device. In the case of a MEMS device with N pairs of combs/parallel plates, the determined gap is the average gap between each pair in the array.

Figure 8:
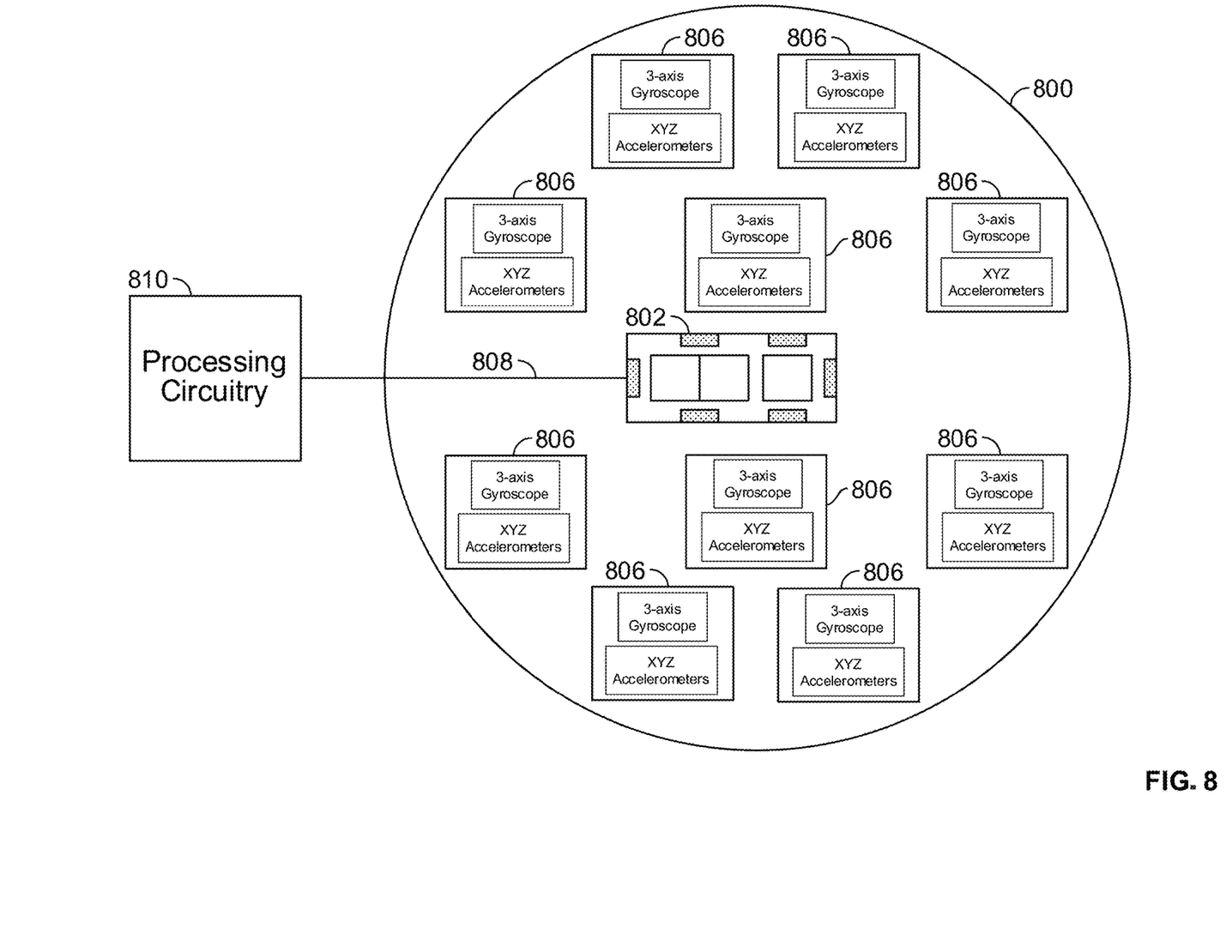
FIG. 8 shows an exemplary view of a production wafer including MEMS dies populated with MEMS sensors and a test structure in accordance with the present disclosure.

FIG. 8 shows an exemplary view of a production wafer including MEMS dies populated with MEMS sensors and a test structure in accordance with the present disclosure. This production wafer 800 includes a test structure 802, a plurality of MEMS dies populated with MEMS devices 806, an electrical coupling 808, and processing circuitry 810. At least one die of the production wafer 800 will include a test structure 802 that is physically bound to the substrate layer 804 and electrically coupled to processing circuitry 810. The plurality of MEMS dies populated with MEMS devices 806 (e.g., gyroscope, accelerometer, microphone, pressure sensor, etc.) are collocated on the wafer 800 with the test structure 802 and have a similar structure (e.g., same sensing plane(s) and similar electrode shapes/proportions) to the test structure 802. In some embodiments of the present disclosure (not depicted in FIG. 8), the test structure 802 may be located with each of the MEMS devices within the plurality of MEMS dies that populate the wafer 800. The test structure is provided with the respective MEMS device(s) in the final MEMS die and end use product. In this manner, changes in gap may be monitored over time and in different conditions, such that appropriate changes to the compensation or operation of the MEMS device based on gap measurements may be determined throughout the operational lifespan of the MEMS device. The MEMS devices may thus use different gap compensation values and/or methods based on the MEMS device's environment (e.g., temperature, humidity, pressure conditions, etc.) and/or how the device gap has changed over time in use.

Processing circuitry 810 may be electrically coupled to the at least the test structure 802, or in some embodiments, may be located within the test structure 802 (e.g., within a processing layer or ASIC of the test structure 802. In some embodiments, some or all of the operations of the processing circuitry may be performed at processing circuitry located remotely from the production wafer, such as at a lab or remote monitoring equipment. The processing circuitry interacts with the test structure 802 to provide test signals to the respective capacitors and measure the capacitances, as described herein. The processing circuitry may also selectively connect to the MEMS devices, for example, to modify scaling or offset values based on the measured capacitances of the test structure as described herein.

Figure 9:
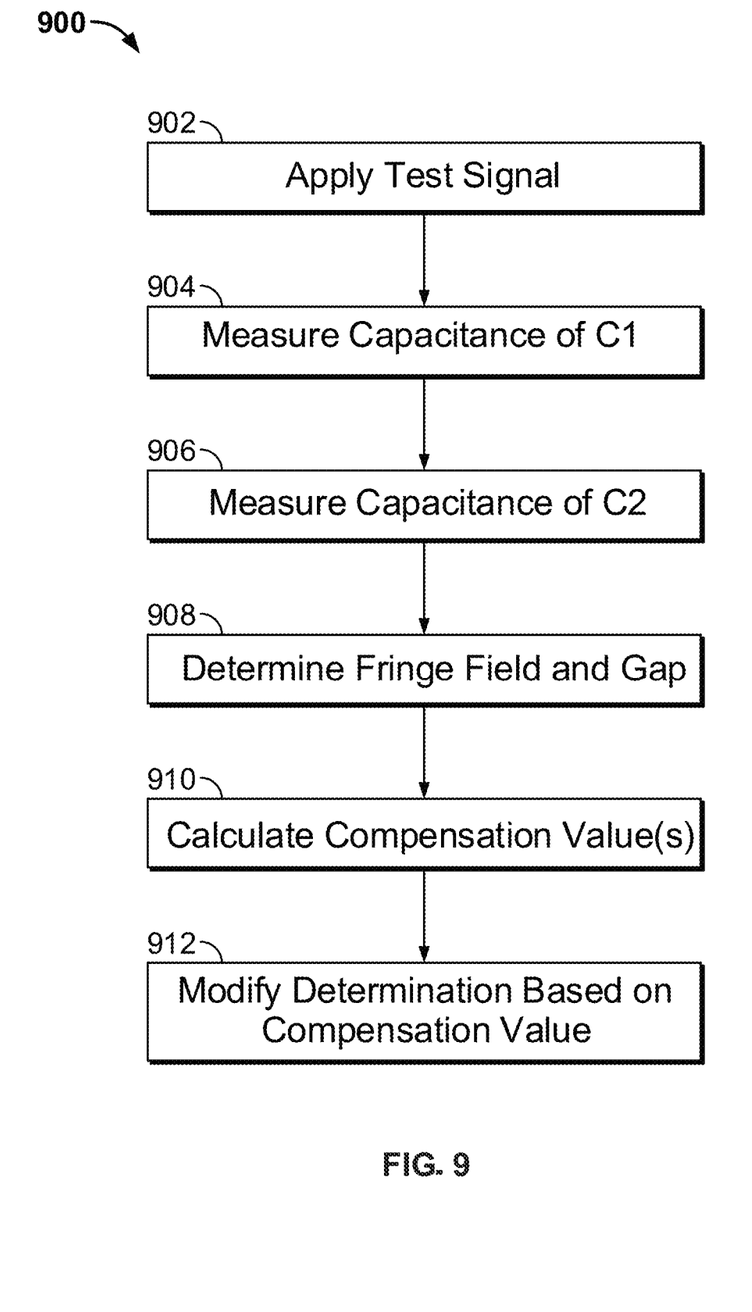
FIG. 9 shows exemplary steps of a method for measuring capacitive gap and fringe field effects in accordance with the present disclosure.

FIG. 9 shows exemplary steps of a method for measuring capacitive gap fringe field effects in accordance with the present disclosure. The method steps include the following: apply field 902, measure capacitance of field 1 904, measure capacitance of field 2 906, estimate fringe field 908, calculate compensation value 910, and modify determination based on compensation value 912.

At step 902, capacitance test signals may be applied to the sense electrodes and/or capacitive plates of the test structure. In an embodiment as described herein, a first capacitor and second capacitor of a test structure may be physically and electrically isolated and may have predetermined shapes and proportions corresponding to the shape of an associated MEMS device. Once the test signals are applied, processing may continue to step 904.

At step 904, the capacitance of a first capacitor (e.g., associated with a first electrode and a first capacitive plate) is measured, e.g., by sensing circuitry of the test structure or processing circuitry coupled to the test structure. Processing then continues to step 906, at which the capacitance of a second capacitor (e.g., associated with a second electrode and a second capacitive plate) is measured in a similar manner. Processing may then continue to step 908.

At step 908, the fringe field and capacitive gap can be determined by simultaneously solving for these variables based on known relationships between the physical structures of the respective capacitors and the measured capacitances of the first and second capacitors. Once these values have been determined, processing may continue to step 910.

At step 910, the fringe field and capacitive gap values may be used to set compensation values, such as scaling and offset values, for MEMS devices associated with the particular test structure, based on predetermined physical relationships between the MEMS devices and the test structure. Once the compensation values are set, the MEMS devices may accurately determine an underlying parameter (e.g., linear acceleration, angular velocity, pressure, etc.) during normal operation, at step 912.

The foregoing is merely illustrative of the principles of this disclosure and various modifications may be made by those skilled in the art without departing from the scope of this disclosure. The embodiments described herein are provided for purposes of illustration and not of limitation. Thus, this disclosure is not limited to the explicitly disclosed systems, devices, apparatuses, components, and methods, and instead includes variations to and modifications thereof, which are within the spirit of the attached claims. The systems, devices, apparatuses, components, and methods described herein may be modified or varied to optimize the systems, devices, apparatuses, components, and methods.

What is claimed is:

1. A microelectromechanical system (MEMS) test structure, comprising:
at least one capacitive plate located in a MEMS layer, a surface of the at least one capacitive plate defining a first plane;
a first sense electrode located on a second plane parallel to the first plane, the first sense electrode defining a first sense electrode area and a first sense electrode perimeter;
a second sense electrode on the second plane parallel to the first plane, the second sense electrode defining a second sense electrode area and a second sense electrode perimeter; and
processing circuitry coupled to the first sense electrode to generate a first sense signal representative of a first capacitance between the at least one capacitive plate and the first sense electrode and to the second sense electrode to generate a second sense signal representative of a second capacitance between the at least one capacitive plate and the second sense electrode, compare the first sense signal to the second sense signal, remove a fringing portion of the compared signals based on the first sense electrode perimeter and the second sense electrode perimeter, and determine a gap between the at least one capacitive plate and the first sense electrode based on the first sense electrode area, the second sense electrode area, and the removal of the fringing portion of the compared signals.

2. The MEMS test structure of claim 1, wherein the first sense electrode is adjacent to the second sense electrode.

3. The MEMS test structure of claim 2, wherein an adequate distance separates a first edge of the first sense electrode from an adjacent second edge of the second sense electrode so that a first fringe field at the first edge does not interact with a second fringe field at the second edge.

4. The MEMS test structure of claim 1, wherein the at least one capacitive plate is anchored by a plurality of anchors along outside edges of the sense electrodes.

5. The MEMS test structure of claim 4, wherein an inward facing portion of each of the plurality of anchors faces at least one of the outside edges.

6. The MEMS test structure of claim 1, wherein the second sense electrode has a square shape.

7. The MEMS test structure of claim 6, wherein the first sense electrode has a rectangular shape and corresponds to two squares of the second sense electrode, wherein a relation among the area ratio of the first sense electrode area and the second sense electrode area, and a relation of the perimeter ratio of the first sense electrode perimeter and the second sense electrode perimeter are known and measurable.

8. The MEMS test structure of claim 1, wherein the ratio of the first sense electrode area and the second sense electrode area is known and measurable.

9. The MEMS test structure of claim 1, wherein the first sense electrode and the second sense electrode are rectangles.

10. The MEMS test structure of claim 1, wherein the first sense electrode and the second sense electrode are circular.

11. The MEMS test structure of claim 1, wherein the processing circuitry removes the fringing portion of the compared signals based on a perimeter ratio of the first sense electrode perimeter and the second sense electrode perimeter, and wherein the removal of the fringing portion of the compared signals takes place external to the MEMS test structure.

12. The MEMS test structure of claim 1, wherein the processing circuitry comprises electrical signal paths for the first sense signal and the second sense signal, and wherein the electrical signal paths are shielded from each other.

13. The MEMS test structure of claim 1, wherein the processing circuitry, while generating the first sense signal, connects the second sense electrode to ground, and wherein the processing circuitry, while generating the second sense signal, connects the first sense electrode to ground.

14. The MEMS test structure of claim 1, wherein the test structure is located on a die on a wafer.

15. The MEMS test structure of claim 14, wherein a plurality of MEMS devices are located on the wafer.

16. The MEMS test structure of claim 15, wherein the test structure is located within a die of a first MEMS device of the plurality of MEMS devices, and wherein an additional test structure is located within a die of each of the plurality of MEMS devices other than the first MEMS device.

17. The MEMS test structure of claim 15, wherein the plurality of MEMS devices comprise a plurality of MEMS gyroscopes, a plurality of MEMS accelerometers, a plurality of MEMS microphones, or a plurality of MEMS pressure sensors.

18. The MEMS test structure of claim 1, wherein the surface of the at least one capacitive plate defining the first plane comprises a bottom surface of the at least one capacitive plate, wherein the second plane is located on a substrate of the MEMS test structure, and wherein the first sense electrode and the second sense electrode are located below the bottom surface of the at least one capacitive plate.

19. The MEMS test structure of claim 1, wherein the surface of the at least one capacitive plate defining the first plane comprises a plurality of side-facing surfaces within the MEMS layer, wherein the second plane comprises a plurality of second planes located within the MEMS layer, wherein the first sense electrode is located on one of the second planes such that it faces one of the side-facing surfaces within the MEMS layer, and wherein the second sense electrode is located on another of the second planes such that it faces another of the side-facing surfaces within the MEMS layer.

20. A method for measuring a capacitive gap of one or more microelectromechanical system (MEMS) sensors by a MEMS test structure, comprising:
  receiving, at processing circuitry from a first sense electrode, a first sense signal representative of a first capacitance between at least one capacitive plate and the first sense electrode, wherein the first sense electrode defines a first sense electrode area and a first sense electrode perimeter;
  receiving, at the processing circuitry from a second sense electrode, a second sense signal representative of a second capacitance between the at least one capacitive plate and the second sense electrode, wherein the second sense electrode defines a second sense electrode area and a second sense electrode perimeter;
  comparing, by the processing circuitry, the first sense signal to the second sense signal;
  removing, by the processing circuitry, a fringing portion of the compared signals based on the first sense electrode perimeter and the second sense electrode perimeter; and
  determining, by the processing circuitry, the gap between the at least one capacitive plate and the first sense electrode based on the first sense electrode area, the second sense electrode area, and the removal of the fringing portion of the compared signals.

21. The method of claim 20, wherein at least a portion of the processing circuitry is located at an external computer or lab equipment.

22. A microelectromechanical system (MEMS) wafer, comprising:
  a plurality of dies including a plurality of MEMS devices, wherein the plurality of MEMS devices comprise a plurality of MEMS gyroscopes, a plurality of MEMS accelerometers, a plurality of MEMS microphones, or a plurality of MEMS pressure sensors;
  at least one die including a test structure, wherein the test structure comprises:
    at least one capacitive plate located in a MEMS layer, the bottom surface of the at least one capacitive plate defining a first plane;
    a first sense electrode located on a second plane parallel to the first plane, the first sense electrode defining a first sense electrode area and a first sense electrode perimeter;
    a second sense electrode on the second plane parallel to the first plane, the second sense electrode defining a second sense electrode area and a second sense electrode perimeter; and
  processing circuitry coupled to the first sense electrode to generate a first sense signal representative of a first capacitance between the at least one capacitive plate and the first sense electrode and to the second sense electrode to generate a second sense signal representative of a second capacitance between the at least one capacitive plate and the second sense electrode, compare the first sense signal to the second sense signal, remove a fringing portion of the compared signals based on the first sense electrode perimeter and the second sense electrode perimeter, and determine a gap between the at least one capacitive plate and the first sense electrode based on the first sense electrode area, the second sense electrode area, and the removal of the fringing portion of the compared signals, wherein the determined gap is representative of a gap of the plurality of MEMS devices.

* * * * *